United States Patent [19]
Coontz

[11] 3,940,740
[45] Feb. 24, 1976

[54] METHOD FOR PROVIDING RECONFIGURABLE MICROELECTRONIC CIRCUIT DEVICES AND PRODUCTS PRODUCED THEREBY

[75] Inventor: Leland I. Coontz, Orange, Calif.

[73] Assignee: Actron Industries, Inc., Monrovia, Calif.

[22] Filed: June 27, 1973

[21] Appl. No.: 374,242

[52] U.S. Cl............ 340/166 R; 29/574; 340/173 R
[51] Int. Cl.²................... H01L 21/70; H01L 27/00
[58] Field of Search..... 340/166 R, 173 R, 173 AM; 29/574, 577, 576, 575; 317/234 M, 235 AJ; 235/153

[56] References Cited
UNITED STATES PATENTS

| | | | |
|---|---|---|---|
| 3,423,822 | 1/1969 | Davidson et al. | 29/577 X |
| 3,553,830 | 1/1971 | Jenny et al. | 29/577 X |
| 3,634,665 | 1/1972 | Carter et al. | 235/153 |
| 3,643,222 | 2/1972 | Kilby | 340/166 R |
| 3,702,985 | 11/1972 | Proebsting | 340/166 R |
| 3,721,964 | 3/1973 | Barrett et al. | 340/166 X |
| 3,781,826 | 12/1973 | Beausoleil | 340/173 AM |

Primary Examiner—Donald J. Yusko
Attorney, Agent, or Firm—Marvin H. Kleinberg

[57] ABSTRACT

The utility of microelectronic devices and the yield of a microelectronic fabricating process is increased by providing, in addition to the desired circuits, "redundant" circuits of the same type. Each circuit has included, in at least one access lead, a nonvolatile, electrically alterable semiconductor device, which can be "set" to either conduct or not conduct power to the circuit.

During testing, only the desired number of devices are rendered accessible by "setting" the semiconductor device to conduct.

A microelectronic device having repetitive rows and/or columns for memory cells or logical processors is provided with additional rows and columns. An electrically alterable device is placed in each row and column. Upon the successful test of each row, the row enabling device is set to a conductive state. Any row containing a defective device is not enabled. If additional defects exist, and no redundant rows are available, redundant columns are disabled to isolate the defective devices.

11 Claims, 3 Drawing Figures

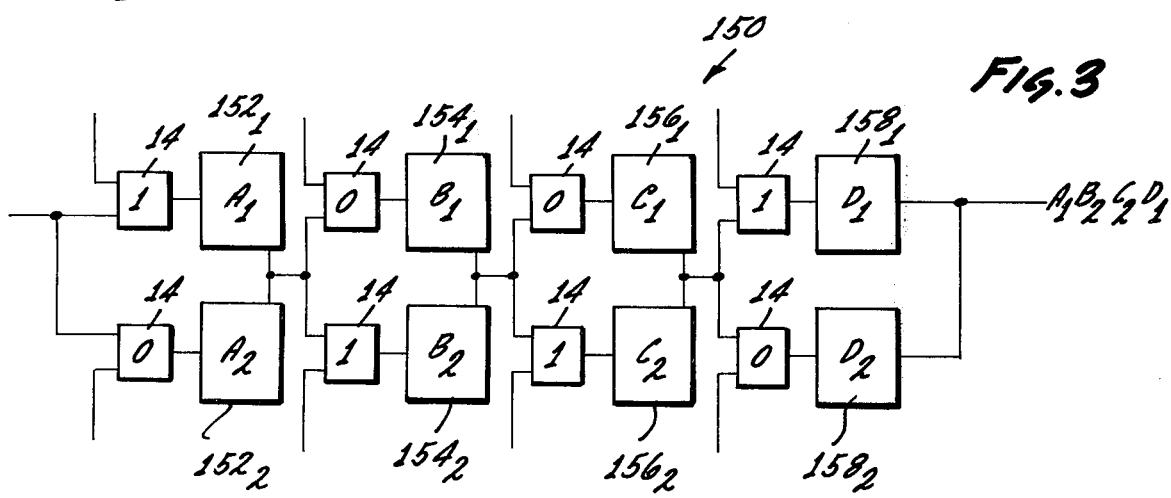

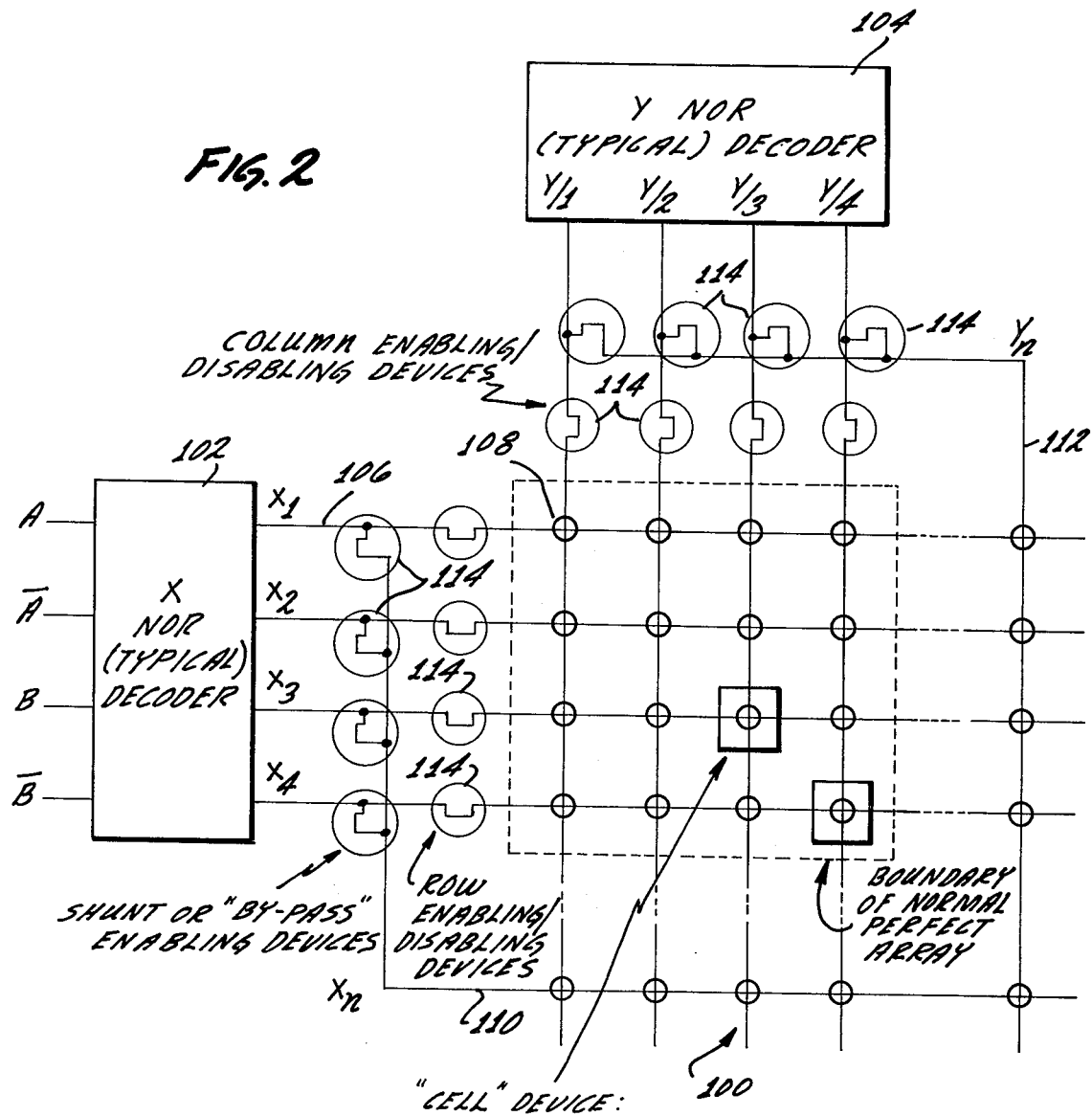

METHOD FOR PROVIDING RECONFIGURABLE MICROELECTRONIC CIRCUIT DEVICES AND PRODUCTS PRODUCED THEREBY

BACKGROUND OF THE INVENTION

The present invention relates to an improved configuration of design and an associated method for semiconductor devices and particularly to a method for increasing the yield ratio or the size, or the size-yield relationship of useful devices to the total processed in a batch fabricating process, and to reconfigurable devices produced by that process.

Description of the Prior Art

Present methods of semiconductor fabrication typically require that a plurality of substantially identical semiconductor elements or circuits be fabricated on a single wafer substrate material in a series of process steps. At the conclusion of the wafer fabrication process, the elements or circuits are tested and defective elements are identified. The substrate wafer is then scored and diced into individual chips, each containing a complete circuit. The "good" chips are then "packaged" to provide electrical connections and appropriate environmental protection, or utilized in hybrid configurations, which in turn can be mounted on circuit boards or otherwise interconnected with other devices to provide electronic circuits.

Because each chip from a wafer includes one of the plurality of substantially identical circuits, the chips containing the defective circuits or devices can be rejected, and all of the remaining, good chips are utilizable. This technique has been deemed desirable because of the almost inevitable occurrence of defects on a wafer as a result of either imperfections in the substrate or anticipated problems in the fabrication process.

Alteration of the circuit configuration of the chip after manufacture has been limited to the use of fusible links or destructive changes in cell characteristics so that such alterations are irreversible and non-repetitive. Incorrect fusing of links, overheating of chips, shorting of adjacent circuit elements and similar failures may be considered defects introduced by the prior art, which made the semi-conductor end product defective. This situation is noted in U.S. Pat. No. 3,656,115 issued Apr. 11, 1972 to Foerster.

Most chip or semi-conductor device defects are, for the most part, random except for massive damage such as scratches or the partial failure of a process step. Therefore, the upper limit size and complexity of circuits that can be fabricated has been a function of the probability of at least one random defect in each chip. For economic reasons a smaller size which compromises size and complexity with defect probability is selected to optimize the yield of a design or production batch.

The number and complexity of devices and circuits produced on a typical wafer is limited by the surface area available for the deposition of circuit elements, the size of those elements and the accuracy in superposition of the successive layers which comprise the circuit elements. Therefore, a compromise must be reached between the complexity of the circuit to be produced and the probability of random failures, which would require the rejection of a circuit.

The problem has been especially troublesome in the fabrication of matrix memory devices. On the one hand, larger memories have become more desirable and large memories could be fabricated on a single wafer. On the other hand, if the rejection rate is high, the costs of producing individual memory components on individual chips, which must then be interconnected utilizing circuit boards and wiring and cabling will be competitive. If the yield of the microcircuit fabrication can be increased to result in a lower cost per chip or packaged device, the added cost and volume of the interconnection and packaging could be avoided.

In the fabrication of a typical matrix memory, such as 32 × 32 matrix for a 1024 bit memory, frequently only one or two random failures are encountered upon testing. Many such memories can be included on a single wafer using existing manufacturing and process techniques and these can be separated into chips for subsequent packaging. However, because of such random defects and processing errors, typically only a fraction of the memories on each wafer can be utilized. Clearly, it would be desirable either to increase the yield from each wafer or to increase the size of memory capable of being fabricated on each wafer.

For many applications, such as logic arrays or arithmetic processing units, predetermined memory storage, unique logical structure or algorithm, or end-product programming are required. This specificity is provided by either a unique chip design usually unsuitable for any other application, by a special variable "mask" for the metalization step in wafer processing, or alternatively by fusible links.

These means provide an invariant configuration which must be selected and implemented in the time of manufacture or prior to assembly or interconnection with more complex circuits or equipment. Once manufactured, or once programmed by fusing of links, these devices cannot be modified to perform alternative functions or to utilize algorithms requiring new fixed circuits.

To give a better understanding of the concept of wafer-scale integration, which is the subject matter of the present invention, it is instructive to consider the following table, which represents various stages in the historic development of microelectronic circuit production techniques.

|  |  | Nominal Active Devices |
|---|---|---|
| SSI | - Small Scale Integration | 1–20 |
| MSI | - Medium Scale Integration | 20–100 |
| LSI | - Large Scale Integration | 100–5,000 |
| VLSI | - Very Large Scale Integration | 5,000–20,000 |
| WSI | - Wafer Scale Integration | 100,000 plus |

It is apparent from this table that wafer scale integration represents the latest and largest of a sequence of quantum jumps by which the development of microelectronic technology has advanced since its beginnings.

As used in this application, "wafer scale" represents the largest possible monolithically aggregated construction. If silicon boules (crystals) of increasingly larger diameter are available, single interconnected circuits covering the entire wafer may be fabricated, in accordance with the present invention. Alternatively, substrates with deposited semiconductor material are available (such as silicon on sapphire) which can be manufactured in even larger wafers than practical to slice from single crystal silicon boules. There is also a process by which it is possible to produce silicon ribbons of great length. On such materials, a step and repeat process could be extended to cover the entire surface with useful devices perhaps to monolithic multi-megabit memories.

The existing art for such wafer scale integration requires testing of the partially fabricated active circuits, creation of a final metalization mask uniquely defined by the quality and adequacy of the partially fabricated circuits, retesting, and then packaging, and finally attaching the external contacts. This process, involving as it does, two or three stages of metalization each followed by a testing stage, has been attempted by several practitioners. The yield of good microelectronic packages of wafer scale dimensions using this process is discouragingly small.

A process requiring the origination of a singular, use once, final or intermediate metalization mask for each full wafer would seem to be almost unworkable as well as prohibitively uneconomic at the present state of the art.

In the process of the present invention, wafer scale integration would be accomplished with only the levels of metalization appropriate to normal processing such as n-channel, p-channel, CMOS, and so on. No additional metalization step is required subsequent to wafer testing — or any singular masking. Since MOS normally requires only one metalization, wafer scale integration would be more conveniently fabricated by these processes. Thus, in the present invention interconnection of good circuits on the wafer is achieved by the use of non-volatile repetitively electrically alterable storage gates which are fabricated onto the wafer in the initial metalization step and this permits the successive metalizations and testing steps required by the techniques of the prior art to be dispensed with at considerable savings in cost and considerable improvement in reliability.

SUMMARY OF THE INVENTION

According to the present invention, redundant or excess rows and columns are added to each matrix. As a part of the fabrication process, one or more non-volatile repetitively electrically alterable storage "gates" or transistors are fabricated into each row and column.

Upon test, each row and column are tested for defects, and if none are found, the electrically alterable gate or transistor is set into a conducting state. If a defect is found, the electrically alterable device is either not enabled or permanently disabled. The extra, redundant rows and columns are inspected until the desired number of "perfect" rows and columns have been found and energized. The requisite number of rows and columns are then energized.

If enough good rows cannot be found, individual columns containing the defective element can be disabled up to the number of "extra" columns. By selectively enabling rows and columns, the adverse effects of random defects can be avoided which would substantially increase the yield.

In other alternative embodiments, yet other complex electronic circuits can be fabricated on a single chip with carefully designed redundancy so that the effect of random errors can be avoided. Integral storage devices, acting as non-volatile, repetitively alterable electronic switches, are used to interconnect the elements of the chip and, by selective setting, only good circuit components are interconnected together. Such a technique would permit the fabrication of more complex circuits on a single wafer to avoid the cost and problems associated with the provision of discrete chips which must be first packaged and then assembled into a larger, more complex configuration.

Another advantage of the packaged chip device produced by the method of this invention would result from incorporating perfect devices with unused redundant elements into complex electronic systems. Using a technique similar but not limited to that of Roth, J. P., IBM Technical Disclosure Bulletin "automatic repair method", Dec. 7, 1967, the system can be reconfigured as failure is observed. Alternatively, the system could be reconfigured as instructed to cause the programming instructions to be modified.

A plurality of electrically alterable storage transistors have been developed and are disclosed, for example, in an article entitled "Electrically Alterable Nonvolatile Semiconductor Memory Technology," published in the Proceedings of the Western Electronics Show and Convention of 1972 (Wescon) by Andrew C. Tickle and Frank M. Wanlass. In that article, several devices are identified, such as the metal nitride oxide silicon (MNOS) storage transistor, the metal oxide semiconductor (FAMOS) storage transistor, and variations in the design of such devices. Further, that article disclosed a new storage device which had been termed, by the authors, as an "electrically alterable resistor" (EAR). Any of such devices would be suitable in the process of the present invention and in the products to be produced thereby.

To illustrate the mechanism by which such electrically alterable non-volatile memory devices operate, the following discussion of the writing and erasing mechanism in the MNOS storage transistor is quoted:

"The most commonly used metal nitride oxide silicon (MNOS) storage transistor uses a thin layer of oxide (20 to 60A) between the silicon nitride gate dielectric and the substrate. The dielectric constant of the silicon nitride is two or more times that of the thin oxide causing the applied field to be doubled in the oxide. This field enhancement and the small thickness permit tunneling of charge to the oxide conduction band once a suitable field has been reached. This charge is stored in traps at or near the oxide/nitride interface. Several years of real time storage have been demonstrated, and ten years may be reasonably predicted.

"In the p channel storage array all MNOS transistors in a given row will experience threshold shift when the negative writing voltage is applied to the gate, except where a negative voltage is applied to the sources and drains. When the writing voltage is applied to the gates an inversion channel forms at the silicon surface, linking the source and drain electrodes. Since the channel forms an ohmic connection to the source and drains it is at the same potential when no current flows. Hence, the source potential may be used to control the channel potential and hence the potential difference across the gate dielectric when the writing voltage is applied to the gate. This is known as 'channel shielding' and is the means by which binary data is selectively entered into an array during programming.

"In order to reset the transistor back into the original state, the simplest method to bias the substrate at a large negative voltage with the gate at ground potential so as to reverse the writing process. This does require that the gate drivers and substrate under the memory array must be isolated from each other to prevent the array gates from shorting to the substrate through the junctions of the array drivers. In this mode there is not selective 'clearing' of the storage transistors; all are reset simultaneously. This is known as 'block erase'."

From the above discussion, it should be clear that the electrically alterable storage gates or transistors used in implementing the present invention are correctly referred to as permanently alterable in that once an alteration has been made to the device the alteration will persist for a period of years. Further, the electrically alterable gates used in implementing the processes of the present invention are correctly referred to as nonvolatile and repetitively alterable, in the sense that the alteration introduced can be erased and the transistor restored to its original condition. The alteration introduced in the gate or transistor electrically alters the electrical structure of the device and that structure is not further altered by the normal use of the gate as a programmable switch.

Many advantages result from the use of the electrically alterable switching elements used in implementing the present invention. Some of these advantages result from the fact that the electrically alterable gates are formed on the same wafer or substrate at the same time as the circuits which are to be interconnected, while other of the advantages are the result of the unique features of the electrically alterable gate. As described above, the use of these devices permits the switching configurations to be automatically latched without the need of special holding circuits. The electrically alterable gates provide the desired low impedance interconnection of busses for signal and power lines. Additional metalization layer is unnecessary. This gives the capability of electrically connecting, or disconnecting and bypassing signal, clock, and power lines, so as to incorporate desired circuits or to inactivate faulty circuits.

The need for discrete packaging and reassembly on conventional printed circuit boards is minimized or potentially eliminated by the present invention. This in turn permits elimination of the off-chip interconnection capacitance, thereby improving speed and noise performance. Higher reliability is achieved by reduction in the number of discrete connections and packages. These advantages are the result of direct connections made on the common wafer substrate.

At the aggregate level, for instance in construction of serial memories, conventional large scale integration has achieved 0.5 cent/bit, whereas the wafer scale integration made possible by the present invention appears likely to achieve 0.01 cent/bit early in production. Additionally, system savings in space, weight, power, and higher signal processing rate may be realized.

It must constantly be remembered that the present invention is concerned with a most useful technique of interconnecting circuits lying on a single wafer, and the nature of these circuits is immaterial to the inventive concept. Thus, in the following discussion the circuits may be referred to as memory cells or otherwise, but it will be understood that the invention applies to all types of logic circuit classes, not just memories, including shift registers, counters, and networks of AND and OR gates. Thus, throughout this application, the description of an embodiment employing memory cells is taken by way of example and not by way of limitation, and for convenience of expression.

Further, it is not essential to the concept of the present invention that the circuits which are to be interconnected be of the same type or class. For example logic circuits could be connected to memory elements.

Further, the description of certain embodiments as comprising rows and columns of circuit elements is by way of illustration and not by way of limitation. Obviously, the geometrical arrangement whether in rows and columns, or circles, or some other configuration is immaterial to the concept of the present invention.

The novel features which are believed to be characteristic of the invention, both as to organization and method of operation, together with further objects and advantages thereof will be better understood from the accompanying drawings in which several preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWING

FIG. 1 illustrates a matrix prepared in accordance with the teachings of the present invention;

FIG. 2 illustrates an alternative form of redundant circuits prepared in accordance with the present invention, configured to be compatible with coder and decoder matrix location addressing; and FIG. 3 illustrates the most general form of a redundant circuit prepared in accordance with the present invention.

DESCRIPTION OF THE PREFERRED EMBODIMENT.

Turning to FIG. 1, there is illustrated in idealized form a matrix assembly 10 which includes rows identified by a subscripted X and columns identified by a subscripted Y. By way of example, it is assumed that a 4 × 4 matrix is desired which would result in some sixteen devices at the cross points.

In each row 12 there is interposed an electrically alterable semiconductor 14, that includes a separate, altering electrode 16. A suitable electrically alterable device is presently available in the art and may be exemplified by one of the devices disclosed in the article entitled "Electrically Alterable Nonvolatile Semiconductor Memory Technology," supra.

An input line 18 is coupled to the device 14 and when a suitable alteration has been made via electrode 16, the row 12 is connected to a row input terminal 18 through the device 14. In the illustration, three redundant identical rows are provided, designated $X_n$, $X_{n+1}$ and $X_{n+2}$, respectively.

The columnar structure is substantially similar to the row structure in that for each of the columns 20, an electrically alterable device 14 having a control electrode 16, is interposed between the column 20 and a column input terminal 22. With appropriate setting of the alterable device 14, the input terminal 22 is directly connected to the column 20. In this embodiment, three redundant columns have also been added and are designated $Y_m$, $Y_{m+1}$ and $Y_{m+2}$, respectively.

For purposes of explanation, it is to be assumed that a 4 × 4 matrix is desired an a 7 × 7 matrix is fabricated on a single semiconductor wafer. In addition to the devices 24 which are fabricated at each of the cross points, the process is also capable of fabricating an electrically alterable semiconductor device 14 in each column 12 and row 20. It is also to be assumed that defective devices 24' exist at the intersections of rows and columns identified as ($X_1$, $Y_2$), ($X_2$, $Y_1$), ($X_3$, $Y_3$) and ($X_4$, $Y_4$). With conventional techniques, the chip containing the 4 × 4 matrix would be wholly unusable and would require rejection.

Assume now that the chip has been fabricated, as shown, including the redundant rows and columns in FIG. 1. On a test of the devices 24 of the first row $X_1$, the defective device 24' in column $Y_2$ will be noted. The fact that all other devices 24 in the row were satisfactory can also be noted. However, because of the defective device in the row, the electrically alterable device 14 is not set. To illustrate, a 0 has been placed within the box graphically representing the electrically alterable device 14.

The second row $X_2$ is also examined and the defective device 24' is noted in the first column $Y_1$. The examination of devices 24 is continued and the defective devices 24' at row $X_3$, column $Y_3$ and rows $X_4$, column $Y_4$ require that none of the rows be energized.

A test is next made of the semiconductor devices in the three redundant rows $X_n$, $X_{n+1}$ and $X_{n+2}$. This test reveals that all of the devices 24 in these rows are operable and accordingly, the electrically alterable device 14 for each of these rows is set to its conducting state, as indicated by the numeral 1 within the box graphically representing the device 14.

At this point it must be noted that there are insufficient energized rows to provide the desired 4 × 4 matrix. It is then necessary to examine the columnar structure. It is known from the initial test that a defect exists in column $Y_1$ at row $X_2$. The first column is then not enabled, as indicated by the 0 in the device 14. A redundant column $Y_m$ is energized, as indicated by the presence of the numeral 1 inside the device 14.

A re-examination of row $X_2$ now reveals that there are at least four operable devices in that row so that the setting of the device 14 can be altered to the conductive state, and accordingly, a 1 is shown in device 14 indicating the energized configuration.

If now the remaining columns $Y_2$, $Y_3$ and $Y_4$ are activated by energization of the storage devices 14, it will be seen that a good, 4 × 4 matrix is available. The 4 × 4 matrix would include rows $X_2$, $X_n$, $X_{n+1}$ and $X_{n+2}$. The columns utilized would be $Y_2$, $Y_3$, $Y_4$ and $Y_m$.

If in the embodiment of FIG. 1 no defects were found in any of devices 24, then the matrix assembly 10 could be provided and sold as a 7 × 7 matrix by maintaining all of the devices 14 in their conductive 1 representing states, or could be reduced in size to any degree to provide any smaller desired matrix, as for example the 4 × 4 matrix obtained with the settings of devices 14 shown in FIG. 1.

Obviously, the same procedure could be followed with larger matrices such as the 32 × 32 matrix of 1024 cross points. To adapt the figure to such a matrix, $n$ and $m$ would equal 33 and a total of 35 rows and columns would be fabricated. In the worst case situation, the system could provide an acceptable matrix with as many errors as redundant columns and rows. For example, a 35 × 35 matrix could have as many as six random errors and yet a usable 32 × 32 matrix device could be produced.

Turning next to FIG. 2, there is shown a similar 4 × 4 memory matrix 100 in which decoding circuits are integral with the memory and are therefore included on the chip. Specifically, in connection with the matrix 100, there is shown an X decoder 102 and a Y decoder 104. The X and Y decoders include the circuits sufficient to convert a 2-bit address into one out of four possible locations.

In the present example, the X decoder 102 is coupled to the several rows 106 and the Y decoder 104 is coupled to the several columns 108. The X decoder 102 selects a one of the four possible rows 106, $X_1$, $X_2$, $X_3$ or $X_4$. The Y decoder 104 selects a one of the four columns 108, $Y_1$, $Y_2$, $Y_3$ or $Y_4$.

As shown in the present example, such a decoder represents no substantial equipment saving in view of as many input lines as output lines. Here, both address signals and complements are applied to the decoders. Other embodiments could employ merely the address signals such as A, B and respond to the signal levels employed. As the memory becomes more complex, the savings become more appreciable. For example, 16 addresses can be identified by 4 bits or 4 complementary pairs of signal lines and 32 addresses can be located using 5 bits or as many as 10 input lines.

One redundant row 110 and one redundant column 112 are included as illustrative for explanatory purposes. Every row and column includes an alterable device 114 which can selectively enable or disable the row or column in which it is connected. Further, the redundant row 110 is coupled to each of the row address lines through a separate, alterable device 114.

Each decoder 102 output line is therefore capable of being connected through two alterable devices 114, one of which connects to a row 106 and the other of which connects to the redundant row 110. Similarly, the columnar output of the Y decoder 104 includes connections to the columns 108 and to the redundant column 112, as well.

In operation, a memory element at each intersection is checked for operability. If all elements of a row 106 are satisfactory, the alterable element 114 associated with that row is enabled and the "shunt" element 114 remains disabled. The alterable devices 110 in rows $X_1$ and $X_2$ are therefore enabled, coupling those rows to the address lines. Similarly, the $Y_1$, $Y_2$ columns are coupled to their respective address lines.

If, however, as a result of the test, one of the cells proves to be defective, as at locations $X_3$, $Y_3$ and $X_4$ $Y_4$, a decision must be made as to whether to disable the row or the column. Here, the row remains disabled. The alterable device 114 coupling the $X_3$ address line to the redundant row $X_m$ 110 is enabled, thereby "replacing" defective row $X_3$ with the redundant row. Next, the alterable device 114 in row $X_4$ is enabled, but the alterable device 114 in the $Y_4$ column line remains disabled. In its place, the $Y_4$ address line is coupled through the second alterable device 114 to the redundant column $Y_n$ 112 and the cells in redundant column $Y_n$ 112 are addressed thereafter whenever the $Y_4$ address line is energized.

With this arrangement, the normal decoding circuits can be mechanized on the chip as a part of the memory device and the address decoders can be used without alteration. Further, from time to time, as memory cells become defective, if sufficient redundancy is provided, a defective row or column can be disabled and a redundant row or column can be called into service in its place.

In this manner, a memory device which has failed in operation can be repaired readily by simply reconfiguring the failed device to disable failed memory cells and enable redundant cells, using the same methods in this respect that were employed in original manufacture.

It will, of course, be understood that each redundant row or column will be accessible to all of the corresponding row or column address lines through electrically alterable devices. Further, it will be clear that of the several alterable devices connected to each of the address output lines, only one will be enabled at any time and the others will be disabled.

Turning next to FIG. 3, there is shown a complex circuit 150 including duplicate circuit elements $A_1$, $A_2$, 152, $152_2$, $B_1$ and $B_2$, $154_1$, $154_2$, $C_1$, $C_2$, $156_1$, $156_2$ and $D_1$, $D_2$, $158_1$, $158_2$ which produce an output representing the serial combination of the circuits A, B, C, D. It is assumed that the outputs of each pair of identical circuits are commonly connected and that the input to each circuit includes an electrically alterable semiconductor device 14. Circuits A, B, C and D need not be of the same type or function. At any one time one of the type A circuits is connected in series to one of the type B circuits, which in turn is connected in series to one of the type C circuits, etc. Which of the A circuits is selected depends on the state of the electrically alterable semi-conductor devices 14 which immediately precede the type A circuits, and likewise for the B, C and D types of circuits. The setting of the state of the electrically alterable devices 14 depends on the results of testing the circuits A, B, C and D.

A circuit such as illustrated in FIG. 3 is then fabricated and tested. One circuit of each identical pair is selected either arbitrarily or on the basis that it is an operable circuit. If it is assumed that random defects existed in circuit $A_2$, $152_2$ and $C_1$, $156_1$, a complete system is created by connecting $A_1$, $152_1$ and $C_2$, $156_2$ into the final configuration. Since both of the B circuits 154 are found to be operable as well as both of the D circuits 158, the selection of $B_2$, $154_2$ and $D_1$, $158_1$ is purely arbitrary. FIG. 3 may be used to illustrate a second embodiment of the circuit shown therein. In that circuit, described below, circuit A1 may be of a different type from circuit A2, B1 of a different type than B2, and so forth.

If in the embodiment of FIG. 3, circuit $B_2$ is provided as an alternate circuit which is different from circuit $B_1$, and if in the same manner circuit $D_2$ is provided as an alternate circuit which is different from circuit $D_1$, then the selection as shown in FIG. 3 of circuits $B_2$ and $D_1$ provides a selective choice of one logic function configuration $A_1B_2C_2D_1$. It is evident that the B and D circuits of the embodiment of FIG. 3 can, if desired, be reconfigured to also provide any one of three other desired logic functions: $A_1B_1C_2D_1$ or $A_1B_2C_2D_2$ or $A_1B_1C_2D_2$.

The connection is indicated by the placing of "1"s within the electrically alterable semiconductor device 14. A disabled electrically alterable semiconductor device 14 is indicated by the presence of a 0 within the block 14. Obviously, the control-terminal for each of the electrically alterable semiconductors 14 would be accessible for setting purposes, as well as the circuits of the devices A, B, C and D for test purposes.

Thus, there has been disclosed a method for increasing the yield and functional utility of devices produced in a batch on a substrate wafer. Substantially redundant circuits are provided and electrically alterable semiconductor devices are used as switches to connect acceptable units into the final configuration.

In a first embodiment, a matrix is fabricated with additional rows and columns so that, by energizing only the required number of rows and columns, as many defective intersections as there are extra rows and columns can be tolerated to produce a usable device.

In other embodiments in which the addressing circuits including address decoders are an integral part of the memory matrix, electrically alterable devices are provided so that the employment of a redundant row or column appears to the addressing circuit at the same address as the defective row or column that has been disabled.

What is claimed as new is:

1. Method of improving the yield of batch processed, microcircuit memory arrays comprising the steps of:
   a. forming on a unitary substrate a microcircuit array of a predetermined number of rows and columns of selection conductors intersecting at memory devices with an electrically alterable switching device in at least all rows;
   b. forming on the same unitary substrate and at the same time the predetermined number of rows and columns are formed at least one additional row including memory devices at all intersections, and an electrically alterable switching device;
   c. altering the associated row switching devices in succession to enable testing of the individual memory cells in each successive row and testing the individual memory cells in each successive row;
   d. disabling those rows containing defective memory cells by realtering the associated row switching device to disable access to the memory cells of the row and, if access to less than the predetermined number of rows has been enabled;
   e. repeating the testing step on the additional row, whereby the additional row can be substituted for a defective row to achieve the predetermined number of rows of the memory array.

2. The method of calim 1, above, wherein:
   a. the forming steps include forming on the same unitary substrate and at the same time the predetermined number of rows and columns are formed, electrically alterable switching devices in all of the columns and the forming of at least one additional redundant column including an electrically alterable switching device in said column;
   b. the testing step further includes the initial altering of the associated column switching devices to enable access to the columns; and if, after the testing step is repeated, less than the predetermined number of rows remain enabled, the further steps of;
   c. enabling one of the previously disabled rows; and
   d. disabling the column in which the defective cell of the previously disabled row is found and enabling the additional redundant column, whereby the additional, redundant row and column are employed to attempt to achieve an array of the predetermined number of rows and columns.

3. The method of claim 2, above, wherein the creating steps further include:
   the forming on the same unitary substrate and at the same time the predetermined number of rows and columns are formed row and column addressing circuits connected to said rows and columns and wherein every row address line is connected to said redundant row through a separate, electrically alterable switching device and every column address line is connected to said redundant column through a separate, electrically alterable switching device; and said disabling step includes the enabling of the address line switching device connecting the additional row or column to the address line of the disabled row or column, whereby an enabled, additional row or column takes the address of a disabled row or column.

4. Method for improving yield of batch processed, microcircuits comprising the steps of:
 a. forming redundant circuits simultaneously with the desired circuits and on the same unitary substrate;
 b. forming electrically alterable switching devices in association with each of said desired and redundant circuits at the same time and on the same unitary substrate as the desired and redundant circuits;
 c. testing said desired circuits for operability;
 d. setting said switching devices to include only operating ones of said desired circuits;
 e. testing said redundant circuits for operability; and
 f. setting said switching devices to include additional ones of the operating, redundant circuits sufficient to provide a predetermined desired operating configuration.

5. The combination with an integrated microelectronic memory array including a predetermined plurality of row and column selection conductors having memory cells at each intersection, for improving the production yield thereof comprising:
 a. a redundant, duplicate row conductor having memory cells located at the intersections with the plurality of column conductors, said redundant row formed on the same unitary substrate and at the same time as the microelectronic memory array;
 b. an electrically alterable switching circuit fabricated in each of the plurality of row conductors and in said duplicate row conductor, for selectively enabling and disabling individual row conductors, said electrically alterable switching circuits formed on the same unitary substrate and at the same time as the microelectronic memory array; and
 c. altering means, integral with the memory array, formed on the same unitary substrate and at the same time as the microelectronic memory array, for selectively enabling individual ones of said switching circuits for testing the memory cells in the row associated therewith and for disabling those rows containing defective memory cells, whereby said redundant row is available to be substituted for a row containing a defective memory cell in attempting to achieve a memory array having a predetermined plurality of operable rows.

6. The combination of claim 5, above, further including:
 additional redundant duplicate row conductors having memory cells located at the intersections with the plurality of column conductors, said additional redundant duplicate row conductors formed on the same unitary substrate and at the same time as the microelectronic memory array;
 electrically alterable switching circuits fabricated in each said additional redundant duplicate row conductor on the same unitary substrate and at the same time as the microelectronic memory array, for selectively enabling and disabling said additional row conductors; and
 said altering means further including means for selectively enabling and disabling said electrically alterable switching circuits in said additional redundant duplicate row conductors for testing the memory cells in the row associated therewith and for disabling the rows containing defective cells.

7. The combination of claim 5, above, further including:
 a redundant duplicate column conductor having memory cells at the intersections with all of said row conductors, said redundant column conductor formed on the same unitary substrate and at the same time as the microelectronic memory array;
 an electrically alterable switching circuit fabricated on the same unitary substrate and at the same time as the microelectronic memory array in each of the plurality of column conductors and in said duplicate column conductors for selectively enabling and disabling individual conductors; and
 wherein said altering means include means for selectively enabling and disabling individual ones of said column switching circuits for testing the memory cells in the columns associated therewith.

8. The combination of claim 7, above, further including:
 additional redundant duplicate column conductors having memory cells at the intersections with row conductors, said additional redundant duplicate column conductors formed on the same unitary substrate and at the same time as the microelectronic memory array;
 electrically alterable switching circuits formed on the same unitary substrate and at the same time as the microelectronic memory array in each said additional redundant duplicate column conductor for selectively enabling and disabling said column conductors; and
 said altering means further include means for selectively enabling and disabling said electrically alterable switching circuits in said additional column conductors for testing the memory cells in the column associated therewith.

9. The combination of claim 8, above, further including:
 additional redundant duplicate row conductors having memory cells located at the intersections with the plurality of column conductors, said additional redundant duplicate row conductors formed on the same unitary substrate and at the same time as the microelectronic memory array;
 electrically alterable switching circuits fabricated in each said additional redundant duplicate row conductor on the same unitary substrate and at the same time as the microelectronic memory array, for selectively enabling and disabling said additional row conductors; and
 said altering means further including means for selectively enabling and disabling said electrically alterable switching circuits in said additional redundant duplicate row conductors for testing the memory cells in the row associated therewith and for disabling the rows containing defective cells.

10. Method for repairing a batch processed microcircuit array wafer having thereon desired circuits in a predetermined operating configuration, each of the circuits having a plurality of electrically alterable switching devices associated therewith which are settable to enable or disable the corresponding circuits, said method comprising the steps of:
 a. testing the desired circuits for operability;
 b. setting the switching devices to include only operating ones of said desired circuits; and
 c. repeating said testing and setting steps to include additional ones of the operating redundant circuits sufficient to provide the predetermined desired operating configuration.

11. Method for reconfiguring to an alternate operating configuration a batch processed microcircuit array wafer having thereon a plurality of desired circuits in a predetermined operating configuration and having alternate circuits corresponding to selected ones of the desired circuits, each of the selected and alternate circuits having electrically alterable switching devices associated therewith which are settable to enable or disable the corresponding circuit, said method comprising the steps of:
 a. setting the switching devices associated with one of the selected circuits to disable that selected circuit in the predetermined operating configuration;
 b. setting the switching devices associated with the corresponding alternate circuit to enable the corresponding alternate circuit in the alternate operating configuration; and
 c. repeating the said setting steps with the associated switching circuits of each of the remaining selected circuits and corresponding alternate circuits until the microcircuit array is reconfigured from the predetermined operating configuration to the alternate operating configuration.

* * * * *